US 11,018,528 B2

(12) United States Patent
Sugiyama et al.

(10) Patent No.: US 11,018,528 B2
(45) Date of Patent: May 25, 2021

(54) WIRELESS POWER TRANSMISSION/RECEPTION SYSTEM, POWER CONVERSION DEVICE INCLUDING THE SAME, AND POWER CONVERSION METHOD

(71) Applicant: HITACHI, LTD., Tokyo (JP)

(72) Inventors: Yoshikazu Sugiyama, Tokyo (JP); Katsuei Ichikawa, Tokyo (JP); Yasuaki Norimatsu, Tokyo (JP)

(73) Assignee: HITACHI, LTD., Tokyo (JP)

( * ) Notice: Subject to any disclaimer, the term of this patent is extended or adjusted under 35 U.S.C. 154(b) by 305 days.

(21) Appl. No.: 16/090,538

(22) PCT Filed: Apr. 6, 2016

(86) PCT No.: PCT/JP2016/061192
§ 371 (c)(1),
(2) Date: Oct. 1, 2018

(87) PCT Pub. No.: WO2017/175319
PCT Pub. Date: Oct. 12, 2017

(65) Prior Publication Data
US 2019/0115789 A1    Apr. 18, 2019

(51) Int. Cl.
*H02J 50/12* (2016.01)
*H02M 7/48* (2007.01)
(Continued)

(52) U.S. Cl.
CPC .............. *H02J 50/12* (2016.02); *H02M 1/08* (2013.01); *H02M 7/4807* (2013.01); *H02J 50/40* (2016.02);
(Continued)

(58) Field of Classification Search
CPC ... H02M 2001/0006; H02M 1/08–096; H02M 7/48–5395; H02M 3/24–3388; H03K 2217/0081; H02J 50/10–12
See application file for complete search history.

(56) References Cited

U.S. PATENT DOCUMENTS

| 9,831,681 B2 | 11/2017 | Shimokawa |
| 2009/0093687 A1 | 4/2009 | Telfort et al. |

(Continued)

FOREIGN PATENT DOCUMENTS

| CN | 101261764 A | 9/2008 |
| CN | 105257564 A | 1/2016 |

(Continued)

OTHER PUBLICATIONS

K. Kusaka et al., "Galvanic isolation system for multiple gate drivers with inductive power transfer—Drive of three-phase inverter," 2015 IEEE Energy Conversion Congress and Exposition (ECCE), Montreal, QC, 2015, pp. 4525-4532. (Year: 2015).*

(Continued)

*Primary Examiner* — Rexford N Barnie
*Assistant Examiner* — David A Shiao
(74) *Attorney, Agent, or Firm* — Volpe Koenig

(57) ABSTRACT

Provided is a power conversion device by which an inverter MOS transistors included in an inverter can be prevented from short-circuiting. It has a DC/DC converter unit converting a voltage of DC power to be inputted, a transformation unit transforming the DC power converted by the DC/DC converter unit, an inverter unit converting the DC power transformed by the transformation unit to AC power, a control unit driving/controlling the inverter unit, a wireless power reception unit receiving power fed by wireless power feed to supply it to the control unit, a wireless power transmission unit transmitting power to the wireless power (Continued)

reception unit, and a power supply unit supplying power to the wireless power transmission unit.

11 Claims, 9 Drawing Sheets

(51) Int. Cl.
| | | |
|---|---|---|
| *H02M 1/08* | (2006.01) | |
| *H02M 1/00* | (2006.01) | |
| *H02J 50/40* | (2016.01) | |
| *H02M 7/5387* | (2007.01) | |
| *H03K 17/687* | (2006.01) | |

(52) U.S. Cl.
CPC .................. *H02M 7/53871* (2013.01); *H02M 2001/0006* (2013.01); *H03K 17/687* (2013.01); *H03K 2217/0081* (2013.01)

(56) References Cited

U.S. PATENT DOCUMENTS

| | | | |
|---|---|---|---|
| 2010/0164295 A1 | 7/2010 | Ichikawa et al. | |
| 2011/0215639 A1 | 9/2011 | Kurosaki | |
| 2014/0049297 A1 | 2/2014 | Nagai et al. | |
| 2014/0049345 A1 | 2/2014 | Nagai | |
| 2014/0169053 A1* | 6/2014 | Ilic | H02J 3/387 |
| | | | 363/132 |
| 2015/0085538 A1* | 3/2015 | Miyauchi | H01F 30/10 |
| | | | 363/21.17 |
| 2015/0155708 A1 | 6/2015 | Bala | |
| 2015/0234417 A1* | 8/2015 | Kawai | H03K 17/691 |
| | | | 323/299 |
| 2015/0311802 A1* | 10/2015 | Loke | H02P 27/04 |
| | | | 318/400.3 |
| 2017/0093299 A1* | 3/2017 | Norimatsu | H02M 3/335 |
| 2017/0237361 A1 | 8/2017 | Morita | |
| 2018/0102713 A1* | 4/2018 | Chen | H02M 3/33546 |

FOREIGN PATENT DOCUMENTS

| | | |
|---|---|---|
| EP | 2353941 A1 | 8/2011 |
| EP | 2566011 A1 | 3/2013 |
| JP | 2004-342325 A | 12/2004 |
| JP | 2007-151224 A | 6/2007 |
| JP | 2009-232502 A | 10/2009 |
| JP | 2012-205379 A | 10/2012 |
| JP | 2013-172466 A | 9/2013 |
| JP | 2015-126587 A | 7/2015 |

OTHER PUBLICATIONS

K. Kusaka, K. Orikawa, J. Itoh, K. Morita and K. Hirao, "Isolation system with wireless power transfer for multiple gate driver supplies of a medium voltage inverter," 2014 International Power Electronics Conference (IPEC—Hiroshima 2014—ECCE Asia), Hiroshima, 2014, pp. 191-198. (Year: 2014).*
R. Steiner, P. K. Steimer, F. Krismer and J. W. Kolar, "Contactless energy transmission for an isolated 100W gate driver supply of a medium voltage converter," 2009 35th Annual Conference of IEEE Industrial Electronics, Porto, 2009, pp. 302-307. (Year: 2009).*
English machine translation of JP2013172466A available Sep. 2, 2013. (Year: 2013).*
European Communication dated Sep. 4, 2020 for European Patent Application No. 16 897 878.1.
International Search Report dated Jun. 14, 2016 for the International Application No. PCT/JP2016/061192.
Extended European Search Report dated Nov. 4, 2019 for the European Patent Application No. 16897878.1.
Chinese Office Action dated Dec. 16, 2019 for the Chinese Patent Application No. 201680083975.2.

* cited by examiner

WIRELESS POWER TRANSMISSION/RECEPTION SYSTEM, POWER CONVERSION DEVICE INCLUDING THE SAME, AND POWER CONVERSION METHOD

TECHNICAL FIELD

The present invention relates to a wireless power transmission/reception system, and a power conversion device including the same.

BACKGROUND ART

Known as a background technique in the present technical field has been Japanese Patent Application Laid-open No. 2007-151224 (Patent Document 1). Patent Document 1 discloses "An AC voltage is generated in a primary winding 24a of a transformer 24 by turning on/off a switching element 23, and this AC voltage is boosted, rectified, and smoothed, and is outputted to a DC/AC link unit 30. The DC/AC link unit 30 includes a diode 31, and a capacitor 32, and a voltage Vdc between both ends of the capacitor 32 is applied to a DC/AC inverter unit 4. Meanwhile, a voltage of auxiliary windings 24c to 24e of the transformer 24 are applied to drive circuits 10a to 10c, and the drive circuits 10a to 10c generate a drive signal (s), and output it to the DC/AC inverter unit 4. A PWM AC voltage is generated in the DC/AC inverter unit 4, smoothed by a LC filter 5, and is outputted to a load 6." (see abstract).

RELATED ART DOCUMENTS

Patent Documents

Patent Document 1: Japanese Patent Application Laid-open No. 2007-151224

SUMMARY OF THE INVENTION

Problems to be Solved by the Invention

A power conversion device, by which power obtained by solar power generation is supplied to grid power of a power company, has recently progressed in increases in power and voltage. In a power conversion device disclosed in Patent Document 1, an inverter is connected to the transformer via a DC/DC converter. Additionally, the voltage of the plural auxiliary windings provided around the transformer of the Dc/DC converter is applied to a gate-control-circuit power supply, and a DC/AC inverter operation is performed.

However, the power conversion device disclosed in Patent Document 1 is configured so that when any failure occurs in the DC/DC converter, a gate control circuit using the voltage of the auxiliary windings cannot maintain an output voltage and a gate potential of a MOS transistor in the inverter becomes unsettled.

This turns on drain-source connection of the MOS transistor connected to a grid of the power company, and grid connection points may be short-circuited.

Therefore, the present invention provides a power conversion device that can prevent short-circuit.

Means for Solving the Problems

The present application includes a plurality of means of solving at least some of the above problems and, if an example is given, is a power conversion device including: a DC/DC converter unit converting a voltage of DC power to be inputted; a transformation unit transforming the DC power converted by the DC/DC converter unit; an inverter unit converting, to AC power, the DC power transformed by the transformation unit; a control unit driving/controlling the inverter unit; a wireless power reception unit receiving power fed by wireless power feed, and supplying the received power to the control unit; a wireless transmission unit transmitting power to the wireless power reception unit; and a power supply unit supplying power to the wireless power transmission unit.

Additionally, if another example is given, it is a wireless power transmission/reception system wirelessly transmitting/receiving power, the system including: a power transmission coil and a power transmission resonance coil, they being magnetically resonated to at least each other; and power reception coils and a power reception resonance coil, they being magnetically resonated to at least one another, in which the power reception coils include a first, second, and third power reception coils, and the first to third power reception coils oppose the power reception resonance coil, are arranged in sequence in a central-axis direction of the power reception resonance coil, and are arranged so that their amounts of power received from the power transmission coil are almost the same.

Effects of the Invention

The present invention can provide the power conversion device capable of preventing the short-circuit.

DETAILED DESCRIPTION OF PREFERRED EMBODIMENTS

Hereinafter, embodiments of the present invention will be described with reference to the drawings.

First Embodiment

Figure 1:
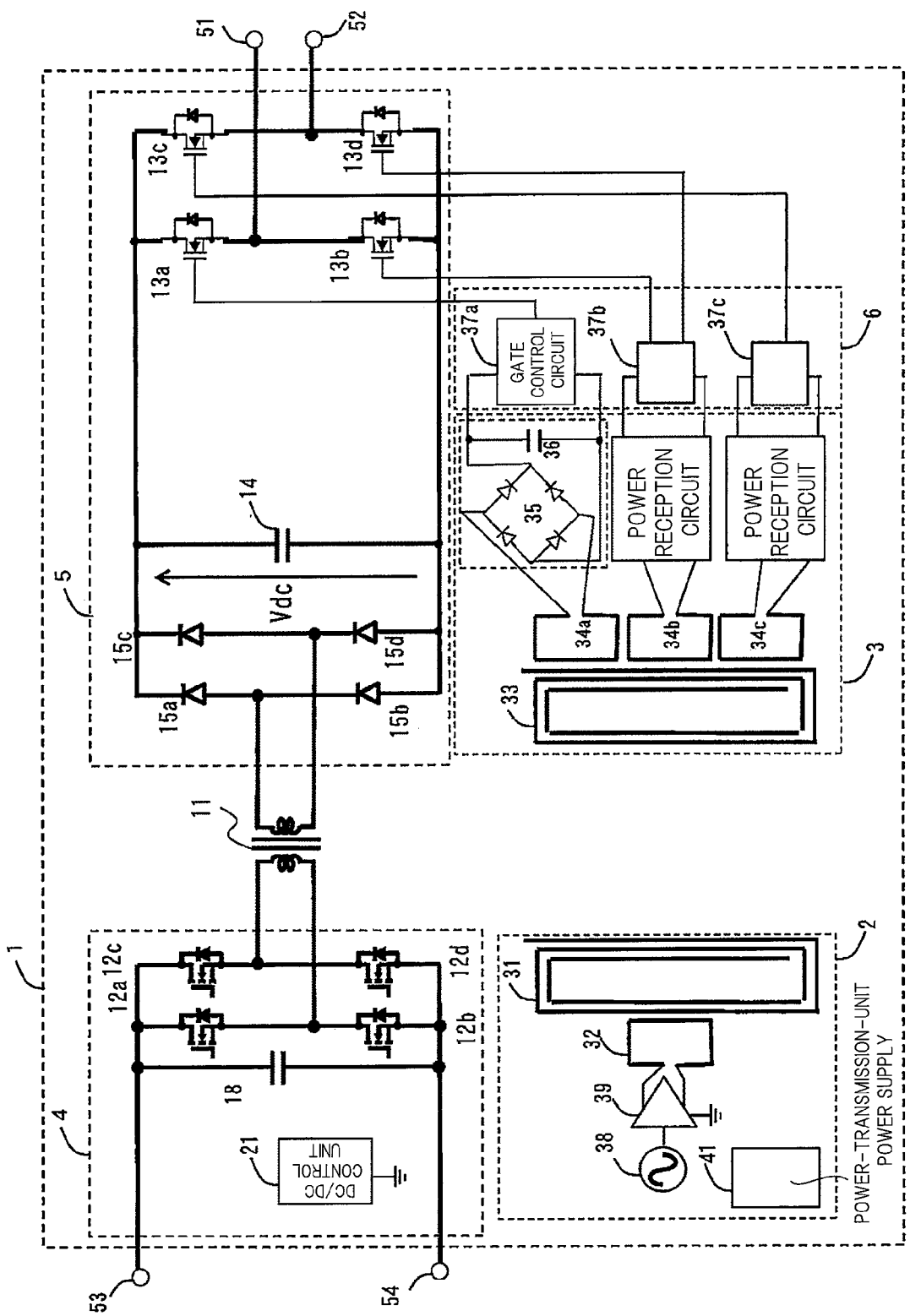
FIG. 1 is a view showing a configuration example of a unit inverter according to a first embodiment of the present invention.

A first embodiment of the present invention will be described with reference to FIGS. 1 and 2. Firstly, FIG. 1 is used to describe a configuration of a power conversion device in the present embodiment. FIG. 1 is a view showing an example of a configuration of a power conversion device according to the present embodiment.

A power conversion device according to the present embodiment has a plurality of unit inverters 1. Each unit inverter 1 includes a wireless power transmission unit 2, a wireless power reception unit 3, a DC/DC converter unit 4, an inverter unit 5, a control unit 6, solar panel connection terminals 53 and 54 (power input unit), a transformer 11, a positive-side inverter output terminal 51, and a negative-side inverter output terminal 52.

The wireless power transmission unit 2 includes a power transmission resonance coil 31, a power transmission coil 32, a transmission amplifier 39, an oscillator 38, and a power-transmission-unit power supply 41. The DC/DC converter unit 4 has switching MOS transistors 12a, 12b, 12c, and 12d, a capacitor 18, and a DC/DC control unit 21.

The inverter unit 5 has inverter MOS transistors 13a, 13b, 13c, and 13d (inverse conversion unit), a link voltage smoothing capacitor 14 (smoothing unit), and rectifier diodes 15a, 15b, 15c, and 15d (forward conversion unit). The wireless power reception unit 3 includes a power reception resonance coil 33, power reception coils 34a, 34b, and 34c, a diode bridge 35, and a power reception smoothing capacitor 36. The control unit 6 has gate control circuits 37a, 37b, and 37c.

Incidentally, FIG. 1 simplifies a power reception circuit having the diode bridge 35 and the power reception smoothing capacitor 36, and includes a portion(s) illustrated by a block diagram.

Next, a positional relation of the configuration in FIG. 1 will be described with reference to FIG. 2. FIG. 2 is a view three-dimensionally showing an example of a structure of the power conversion device according to the present embodiment. The same reference numerals as those in the drawing of FIG. 1 regarding FIG. 2 indicate the same configurations as those of FIG. 1. Mounted on a printed board (substrate) are the wireless power transmission unit 2, wireless power reception unit 3, DC/DC converter unit 4, and inverter unit 5.

The wireless power transmission unit 2 is provided separately from and opposite to the wireless power reception unit 3 so as to transmit power to the wireless power reception unit 3.

More specifically, the power transmission and reception resonance coils 31 and 33 are formed on the printed board, and made of copper foil patterns. Additionally, the power transmission and reception resonance coils 31 and 33 are arranged separately from and opposite to each other so that respective centers of the coils overlap on the same axis.

A power transmission coil 32 is formed by winding one turn of a copper wire having a diameter of 1.0 mm, and soldered on the printed board, and its center overlaps with a central axis of the power transmission resonance coil. The power reception coils 34a to 34c are arranged via the power reception resonance coil 33 so as to have substantially the same level in magnitude of power received by them.

Incidentally, the diameter of the copper wire is not limited to 1.0 mm, and may appropriately vary depending to power etc. to be transmitted.

Next, FIG. 1 is used to describe each configuration of the present embodiment. In FIG. 1, a DC voltage outputted by a solar panel is inputted to the DC/DC converter unit 4 via the solar panel connection terminals 53 and 54. The DC voltage inputted to the DC/DC converter unit 4 is outputted to the voltage-converted transformer 11 through the switching MOS transistors 12a to 12d controlled by the DC/DC control unit 21.

The DC voltage outputted from the DC/DC converter unit 2 is boosted by the transformer 11, and is inputted to the forward conversion unit of the inverter unit 5. The forward conversion unit forwardly converts the inputted DC voltage, and outputs it to the smoothing unit. The smoothing unit smooths the DC voltage having been forwardly converted by the forward conversion unit, and outputs a link voltage Vdc to the inverse conversion unit.

Incidentally, the transformer 11 has a withstand voltage between an inverter output voltage and a GND potential of the DC/DC converter unit 4.

The gate control circuits 37a to 37c (control unit) PWM-control gates of the invertor MOS transistors 13a to 13c. The forward conversion unit converts the link voltage Vdc by switching of the PWM-controlled inverter MOS transistors 13a to 13c, and outputs commercial AC power.

The oscillator 38 outputs, to the transmission amplifier 39, power oscillated with a frequency Fr of electromagnetic field resonance due to the power transmission and reception resonance coils 31 and 33. The transmission amplifier 39 amplifies the inputted power, and outputs it to the power transmission coil 32. Those receive the power by the power-transmission-unit power supply 41 that is another grid independent of the DC/DC converter unit 4.

An electromagnetic field (power) generated in (outputted from) the power transmission coil 32 is transmitted to the power reception coils 34a to 34c by an electromagnetic coupling of the power transmission and reception resonance coils 31 and 33. The power-received electromagnetic field is smoothed to a DC voltage by a power reception circuit having the diode bridge 35 and the power reception smoothing capacitor 36, and becomes a power supply voltage of the gate control circuits 37a to 37c (control unit 6).

Consequently, even if the DC/DC converter unit 4 fails, the wireless power transmission unit 2 can continuously supply the power to the control unit 6, so that drive/control of the inverter MOS transistors 13a to 13d in the forward conversion unit can be prevented from being unstable. Therefore, the inverter MOS transistors 13a to 13d can be prevented from short-circuiting.

Comparison with a conventional technique in this respect is as follows. The conventional technique has used, for drive/control of a switching element in a forward conversion unit, power supplied from a DC/DC converter unit via a transformer. Consequently, when the DC/DC converter unit fails, supply of the power for drive/control of the switching element in the forward conversion unit is also stopped and a switching operation of the switching element becomes unstable, so that transistors etc. may be short-circuited.

Meanwhile, the present embodiment separates, from a power supply grid of the DC/DC converter unit 4, a power grid to the control unit 6, so that the inverter MOS transistors are prevented from short-circuiting even when the DC/DC converter unit fails.

Additionally, an insulation withstand voltage coinciding with an inverter output voltage is necessary between the DC/DC converter unit 4 and the inverter unit 5. For example, a three-phase grid voltage of a power company requires 6.6 kV as an insulation withstand voltage. In this case, if a space of 11.0 mm or more is secured between the DC/DC converter unit 4 and the inverter unit 5, they can be insulated from each other.

Meanwhile, the conventional technique supplies, via the transformer from the DC/DC converter unit, the power for driving/controlling the switching element in the forward conversion unit, so that the transformer needs to be enlarged for securing a withstand voltage of the transformer. Additionally, even if a source of supply of the power for this drive/control is obtained from another grid different from a grid of supply from the DC/DC converter unit, it is difficult to secure insulation properties for obtaining a high withstand voltage for the future.

Figure 2:
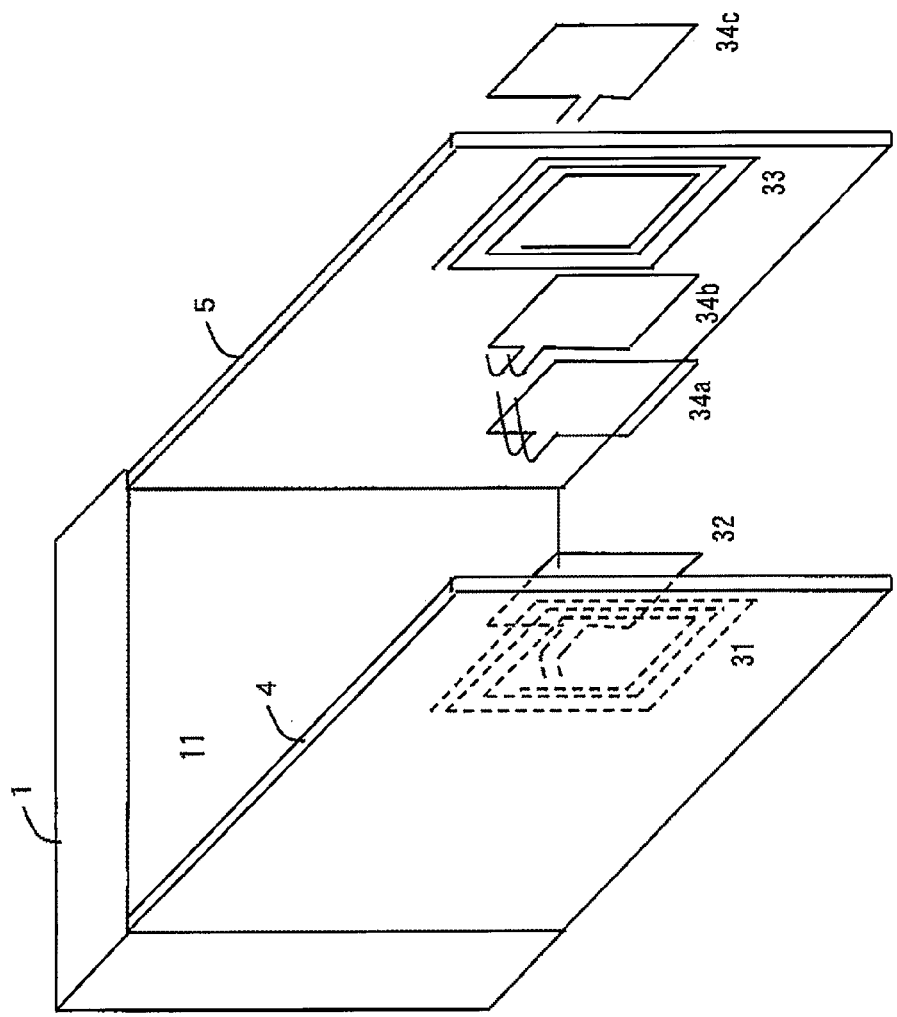
FIG. 2 is a view showing a configuration example of a three-dimensional structure of the unit inverter according to the first embodiment of the present invention.

In contrast, as shown in FIG. 2, the present embodiment can secure the insulation properties having an insulation withstand voltage of 6.6 kV since the power transmission coil 32 and the power reception coils 34a and 34b are spaced apart from one another by an inter-board distance (e.g., 60 mm).

As described above, when the switching MOS transistors 12a to 12d and/or the DC/DC control unit 21 in the DC/DC converter unit 4 fail, a current is not generated at a secondary side of the transformer 11 and the link voltage Vdc is not generated at the inverter unit 5. Even if such current and voltage are not generated, the present embodiment maintains the power supply voltage of the gate control circuits 37a to 37c by the power-transmission-unit power supply 41 serving as another power supply, and controls the inverter MOS transistors 13a to 13d to be able to stop an output between the positive-side inverter output terminal 51 and a negative-side inverter output terminal 52.

Additionally, the insulation withstand voltage coinciding with a voltage between the inverter output terminals 51 and 52 is necessary between the inverter MOS transistors 13a and 13c and between the inverter MOS transistors 13a and 13b. In contrast, the present embodiment can also secure such an insulation withstand voltage by separating the power reception coils 34a and 34b from each other and the power reception coils 34b and 34c from each other to insulate them by air.

Incidentally, a configuration in which power transmission is divided by the power transmission and reception coils and the resonance coil has been described, but the power transmission may use a power transmission and reception side coils to be electromagnetically coupled by serial or parallel resonance.

Further, the present embodiment has been described about a case where the number of power reception coils is three, but it is not limited to three. The number of power reception coils may be one or two by sharing the power reception coil on a control unit side. The number of power reception coils may vary depending on the number of inverter MOS transistors to be controlled.

Moreover, the magnetic field power-received in the above descriptions has been mentioned so as to become the power supply voltage of the gate control circuits 37a to 37c, but may supply power to a voltage sensor, a current sensor, and/or a microcomputer, etc. not shown besides.

As describe above, the power conversion device according to the present embodiment can secure insulation resistance and be prevented from short-circuiting.

Second Embodiment

Figure 3:
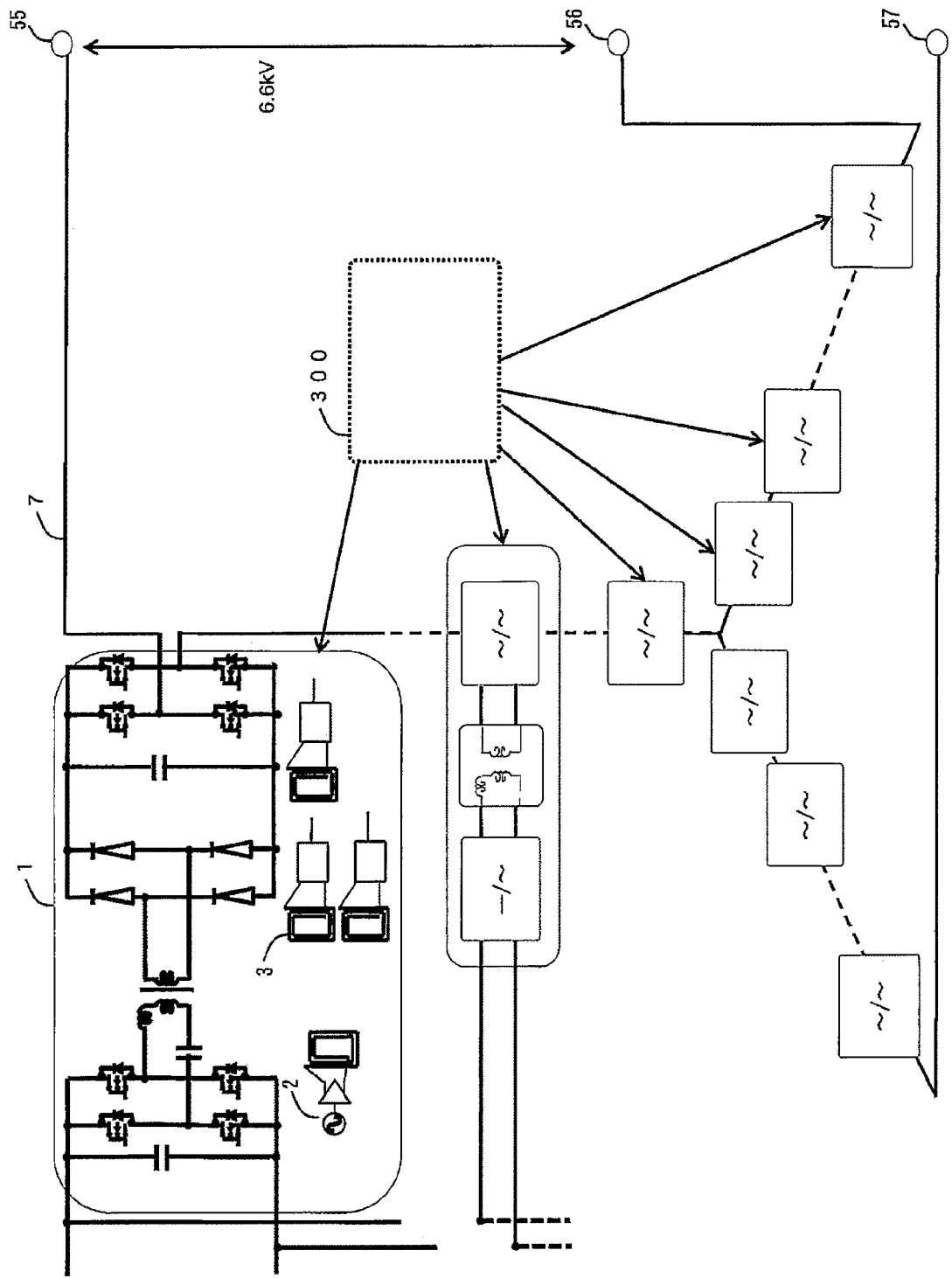
FIG. 3 is a view showing a configuration example of a multiple inverter according to a second embodiment of the present invention.

Next, a power conversion device according to the present embodiment will be described with reference to FIG. 3. The present embodiment relates to a multiple inverter 7 in which a plurality of unit inverters 1 composed of the unit invert 1 in the first embodiment are connected in series. FIG. 3 is a view showing a configuration example of a multiple inverter 7 according to the present embodiment. Omitted will be descriptions overlapping with the descriptions of the power conversion device according to the first embodiment.

The multiple inverter 7 includes a plurality of unit inverts 1, a central control device 300, a U-phase output terminal 55, a V-phase output terminal 56, and a W-phase output terminal 57.

A negative-side output terminal 52 of the unit inverter 1 is connected to a positive-side output terminal of another unit inverter. When such connection is made multi-stage in series, a unit inverter output voltage ±Vdc is multiplied by N times and can be outputted to the U-phase output terminal 55.

For example, if a U-phase output voltage to be required is 6.6 kV and a series stage number N is eight, Vdc=6600÷2÷8=412.5 V. Therefore, the output of the unit inverter 1 is ±412.5 V, and an output of the multiple inverter having 6.6 kV is obtained.

Incidentally, this applies also to the V-phase and W-phase output terminals similarly thereto, so that their descriptions will be omitted.

The present embodiment connects in series the unit inverters 1, each of which includes the wireless power transmission unit composed of the power transmission resonance coil 31 etc., and the wireless power reception unit composed of the power reception resonance coil 33 etc. The central control device 300 controls the DC/DC control unit in each unit interval so that a U-phase output, which is the sum of output voltages between the respective positive-side output terminals 51 and the respective negative-side output terminals 52, becomes a sine wave.

The multiple inverter 7 incorporates the V-phase and W-phase output terminals besides those series-connected inverters, and controls the central control device 300 so as to output a three-phase AC to the U-phase, V-phase, and W-phase output terminals 55 to 57.

When the multiple inverter 7 having the plural unit inverters 1 is operated like the above, an insulation withstand voltage among the inverter MOS transistors 13a to 13c can be secured at 412.5 V or more while an insulation withstand voltage between the DC/DC converter unit 4 and the inverter unit 5 is secured at 6.6 kV or more. Additionally, when the DC/DC converter unit 4 fails, the outputs of the positive-side output terminal 51 and the negative-side output terminal 52 are controlled, so that each output of the U-phase, V-phase, and W-phase output terminals 55 to 57 can be stably stopped.

As described above, the present embodiment can provide the multiple inverter 7 that can secure insulation resistance and be concurrently prevented from short-circuiting.

Third Embodiment

Figure 4:
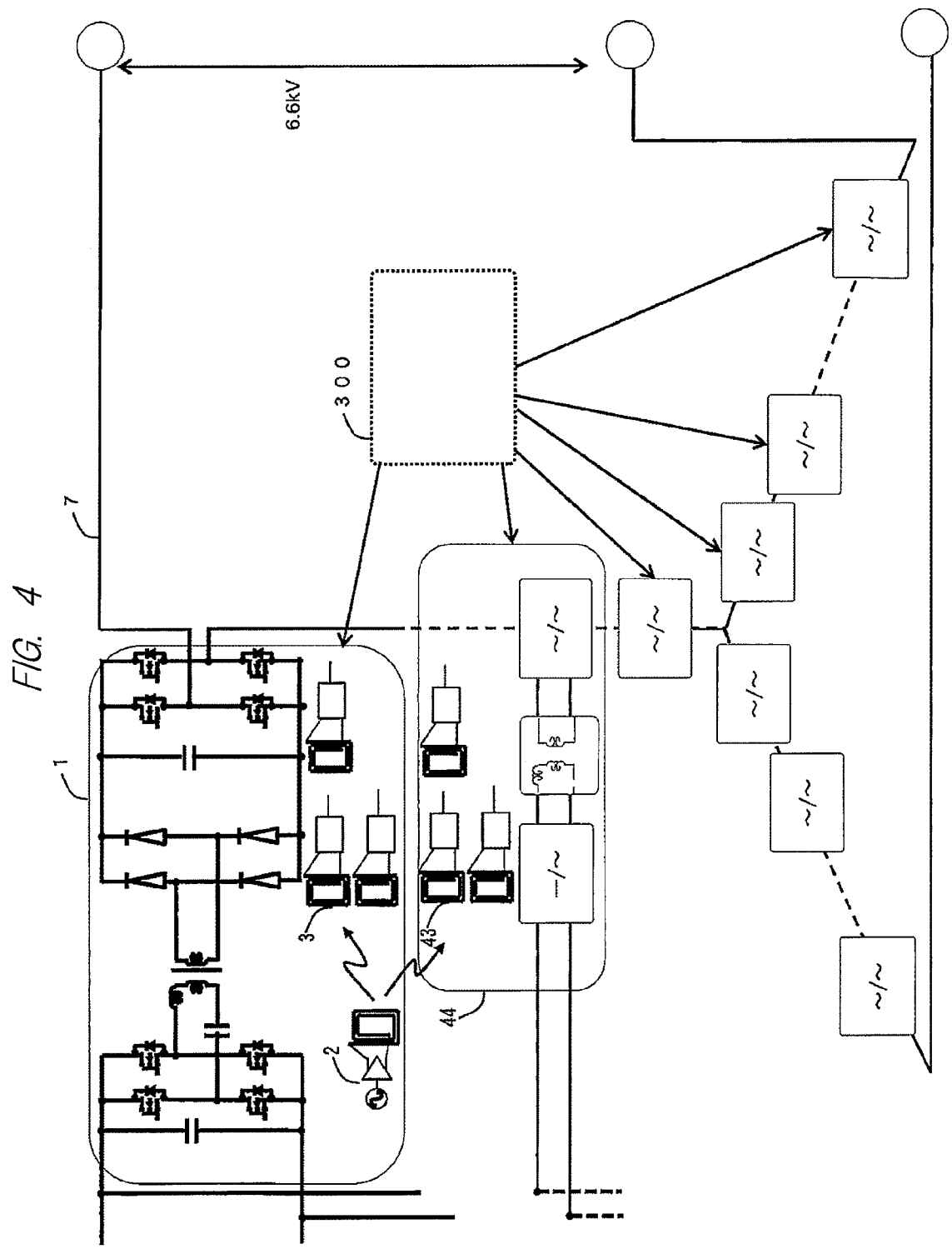
FIG. 4 is a view showing a configuration example of a multiple inverter according to a third embodiment of the present invention.

The present embodiment will be described with reference to FIG. 4. FIG. 4 is a view showing a configuration example of a multiple inverter 7 according to the present embodiment. Descriptions overlapping with the descriptions made thus far will be omitted hereinafter.

FIG. 4 is different from FIG. 3 in that a multiple inverter 7 has a unit inverter 4 incorporating the wireless power reception unit 3 and not incorporating the wireless power transmission unit 2.

Figure 5:
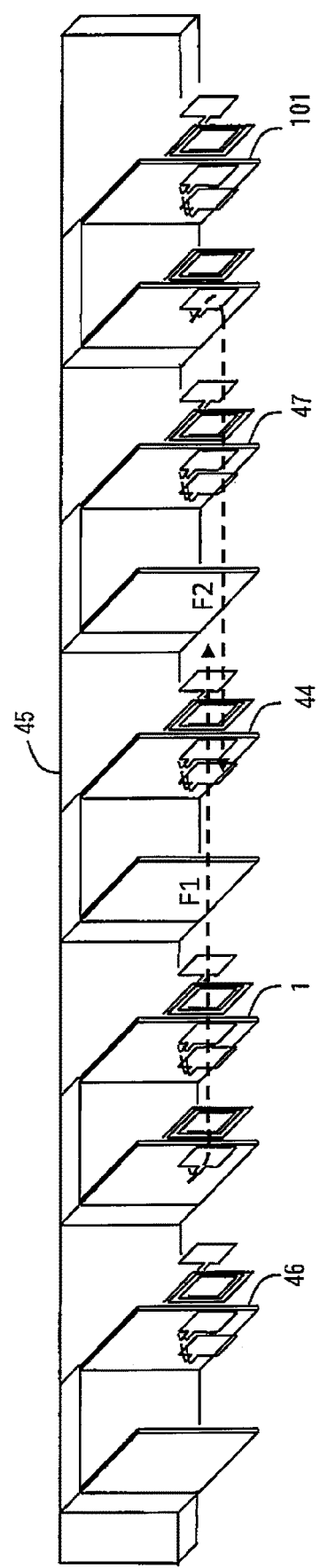
FIG. 5 is a view showing a configuration example of a three-dimensional structure of a unit inverter according to the third embodiment of the present invention.

FIG. 5 is a view showing a configuration example of a three-dimensional structure of a multiple inverter 7 according to the present embodiment. In FIG. 5, the multiple inverter 7 includes a multiple inverter rack 45, unit inverters 1 and 101 each having both of the wireless power transmission and reception units, unit inverters 44, 46, and 47 each having only the wireless power reception 3. The power reception resonance coil 33 of each wireless power reception unit 3 is arranged on the multiple inverter rack 45 so that its center becomes coaxial with each center of power reception resonance coils of other unit inverters. The power reception resonance coil 31 is arranged on the multiple inverter rack 45 so that its center becomes coaxial with the center of the power reception resonance coil in the wireless power reception unit to be power-transmitted.

Incidentally, the wording "coaxial" mentioned herein includes not only being completely on the same axis but also being in the vicinity of the same axis. Additionally, the wording "vicinity" may fall within, for example, such a range that if the maximum of power transmission (reception) efficiency is 100%, the power transmission (reception) efficiency is about 95%. However, this value of 95% is merely one example, and may appropriately be varied depending on the required power transmission (reception) efficiency.

An electromagnetic wave having a frequency F1 outputted from the wireless power transmission unit 2 in the unit inverter 1 reaches the power reception resonance coil 33 of the wireless power reception unit 3 in the adjacent unit inverter 44, thereby transmitting power to the wireless power reception unit 3 in the unit inverter 44. The power received by the wireless power reception unit 3 is rectified and becomes a gate-control-unit power supply voltage.

Meanwhile, an electromagnetic wave having a frequency F2 outputted by the wireless power transmission unit 42 in the unit inverter 101 reaches and concurrently passes the power reception unit 3 in the adjacent unit inverter 47, and further reaches the power reception resonance coil 33 in the adjacent unit invert 44. Consequently, the wireless power reception unit 3 in the unit inverter 44 receives power, and the received power is rectified and becomes a gate-control-unit power supply voltage.

The unit inverter 44 like this receives, even if its own DC/DC converter unit 4 does not have the wireless power transmission unit 2, the power of the frequencies F1 and F2 from other unit inverters and causes the gate control unit to operate.

Consequently, for example, a configuration of FIG. 5 makes it possible to operate five unit inverters by two unit inverters each having the wireless power transmission unit 2, and brings an effect of reducing costs due to a reduction in the number of parts.

Incidentally, a ratio between the unit inerter, which has the wireless power transmission and reception units 2 and 3, and the unit inverter, which has only the wireless power reception unit 3, is not limited to the above-mentioned example. The ratio can be appropriately changed depending on magnitude of the transmitted power from the wireless power transmission unit 2 and/or on a positional relation between the wireless power transmission and reception units 2 and 3.

Additionally, the central control device 300 controls the wireless power transmission unit 2 so that the unit 2 can supply almost the same level of power to the respective wireless power reception units 3. Consequently, for example, the wireless power reception unit 3 receiving power from two wireless power transmission units 2 can increase, even if a power transmission output from one of the wireless power transmission units 2 becomes weak (low), a power transmission output from the other wireless power reception unit 2. The increase in the power transmission output makes it possible for the wireless power reception unit 3 to receive supply of the stable power.

Further, the frequency F1 power-transmitted by the unit inverter 1 and the frequency F2 power-transmitted by the unit inverter 101 are, in an example as mentioned above, the same frequency. However, even if the frequencies F1 and F2 are different, such a case is also included in one aspect of the present invention.

As described above, the present embodiment can secure the insulation resistance, be concurrently prevented from short-circuiting, and provide the multiple inverter at low costs.

Fourth Embodiment

Figure 6:
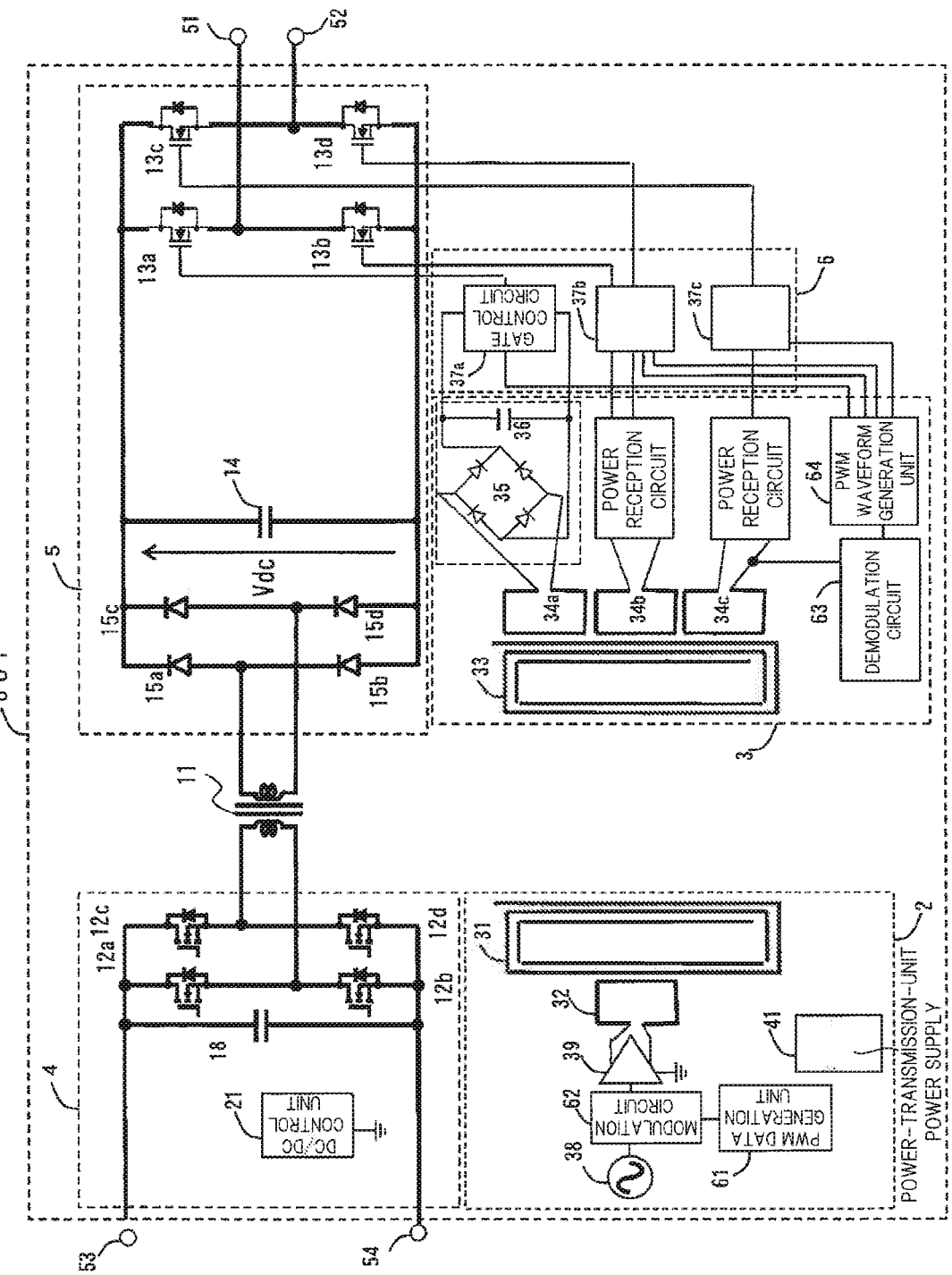
FIG. 6 is a view showing a configuration example of a unit inverter according to a fourth embodiment of the present invention.

A unit inverter according to the present embodiment will be described with reference to FIG. 6. FIG. 6 is a view showing a configuration example of a unit inverter according to the present embodiment. Descriptions overlapping with the descriptions made thus far will be omitted hereinafter.

FIG. 6 is different from FIG. 1 in that a unit inverter 601 according to the present embodiment includes a PWM data generation unit 61, a modulation circuit 62, a demodulation circuit 63, and a PWM waveform generation unit 64 (control signal output unit). The demodulation circuit 63 is connected to any of the power reception coils 34a to 34c.

The present embodiment is configured to control the inverter MOS transistors 13a to 13d in the inverter unit 5 by PWM (pulse width modulation) and output a sine wave.

In FIG. 6, the PWM data generation unit 61 calculates a duty ratio of PWM waveforms to be applied to gates of the inverter MOS transistors 13a to 13d, and outputs the ratio as duty-ratio data (control signal). The modulation circuit 62 digitally modulates, in a manner of MSK modulation, a power transmission waveform outputted from the oscillator 38 based on the duty-ratio data outputted from the PWM data generation unit 61.

Incidentally, this modulation method is not limited to the MSK modulation, and may be digital modulation like any of FSK, QPSK, and QAM modulation, etc. besides the MSK modulation.

The power transmission coil 32 power-transmits the modulated power transmission waveform to the power reception coils 34a to 34c via the power transmission resonance coil 31. The power transmission waveform received and demodulated by the power reception coil 34c is inputted to the demodulation circuit 63, and digitally modulated in the manner of MSK modulation. The demodulated duty-ratio data is converted, by the PWM waveform generation unit 64, to a PWM waveform applied to the gates of the inverter MOS transistors 13a to 13d, and is outputted to each of the gate control circuits 37a to 37c. The gate control units 37a to 37c drive and control the inverter MOS transistors 13a to 13d based on the inputted PWM waveform.

Such an operation makes it possible to use a power transmission circuit by wireless to transmit the duty-ratio data for controlling the inverter MOS transistors 13a to 13d. This brings unnecessitating a high withstand voltage photocoupler and/or an optical fiber conventionally used for transmitting the duty-ratio data to the gate control circuit, thereby being able to achieve the reduction in costs of the unit inverter.

As described above, the present embodiment can maintain (hold) the insulation resistance of the unit inverter, be concurrently prevented from short-circuiting, and further provide the unit inverter at low costs.

Fifth Embodiment

Figure 7:
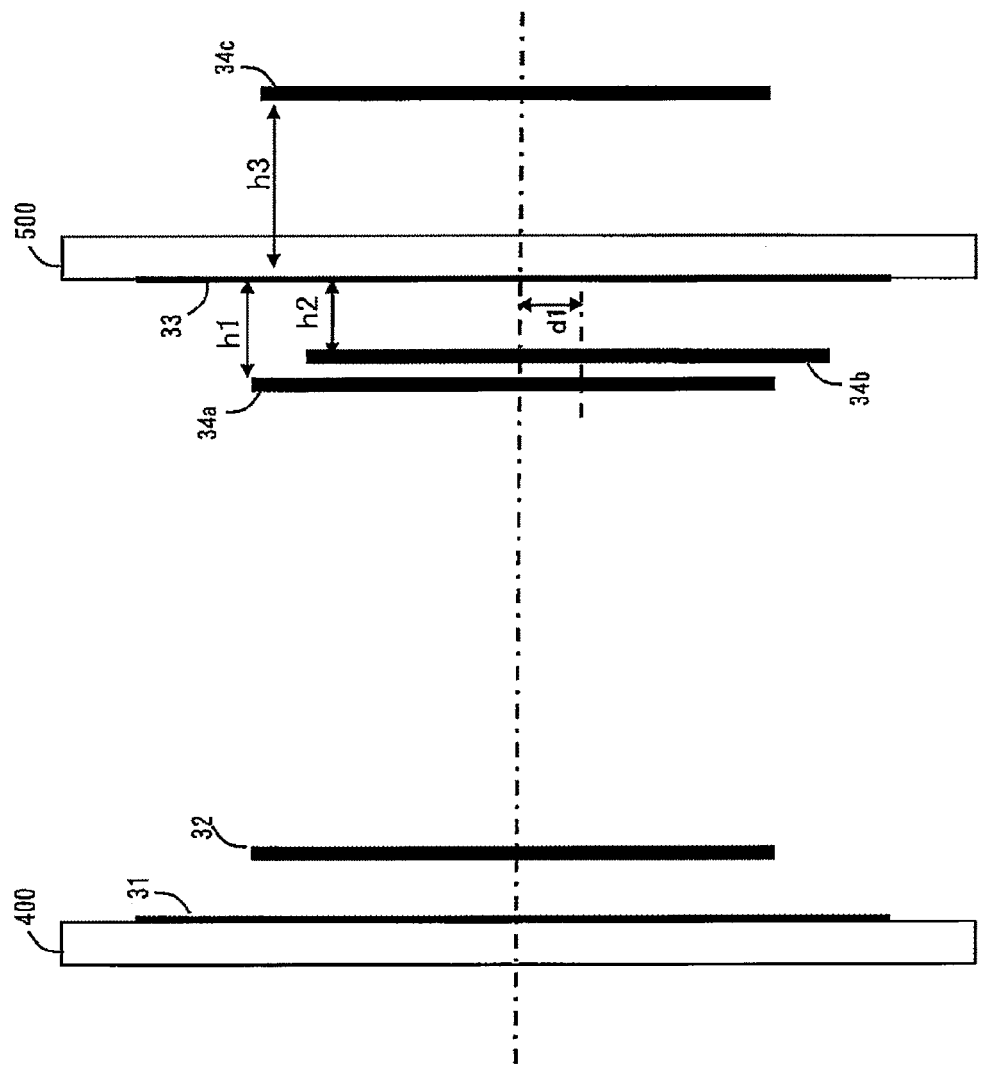
FIG. 7 is a view showing an example of a positional relation between coils in a wireless power transmission/reception system according to a fifth embodiment of the present invention.

A wireless power transmission/reception system in a unit invert 1 according to the present embodiment will be described with reference to FIG. 7. FIG. 7 is a view showing an example of a positional relation between coils in a wireless transmission/reception system according to the present embodiment.

In FIG. 7, the power transmission resonance coil 31 is provided on a surface on a printed board 500 side out of surfaces of a printed board 400 on which the DC/DC converter unit 4 is mounted, the inverter unit 5 being mounted on a printed board 500. Additionally, the power reception resonance coil 33 is provided on a surface on a printed board 400 side out of surfaces of the printed board 500 on which the inverter unit is mounted, the DC/DC converter unit 4 being mounted on the printed board 400. The power transmission and reception resonance coils 31 and 33 are formed on the printed boards and made of copper foil wirings.

The power transmission coil 32 and the power reception coils 34a and 34b are provided between and separately from the printed boards 400 and 500. The power reception coil 34c is provided opposite the power reception coils 34a and 34b. Each of the power reception coils 34a to 34c is composed of one turn, is fixed to the printed boards 400 and 500 by soldering etc., and supplies the received power to the gate control circuits 37a to 37c of the respective inverter MOS transistors 13a to 13c.

Here, when the power is supplied to respective different circuits from one power transmission coil through a plurality of power reception coils in order to control the gates of the respective inverter MOS transistors 13a to 13c, it is desirable that amounts of power received by the respective power reception coils become almost equal to each other.

In contrast, in the wireless power transmission/reception system according to the present embodiment, the power transmission and reception coils 31 and 33 are arranged so as for their centers to be on substantially the same axis (hereinafter, "central axis"). Additionally, the power reception coil 34a is spaced apart from the power reception resonance coil 33 by a distance h1 on almost the same axis as the central axis. Meanwhile, the power reception coil 34b has a center deviated from the central axis by a distance d1, and is spaced apart from the power reception resonance coil 33 by a distance h2. Additionally, the power reception coil 34c is spaced apart from the power reception resonance coil by a distance h3 on almost the same axis as the central axis.

Those distances have a relation of h2<h1<h3 therebetween.

The amounts of power received by the power reception coils 34a to 34c become larger as they are closer to the power reception resonance coil in distance. Additionally, the amount of power received by the power reception coil 34b decreases by an amount of deviation of its center from the central axis. Therefore, the amount of power received by the power reception coil 34c, whose distance from the power reception resonance coil is the farthest distance h3, becomes the smallest amount. Since the power reception coil 34a is closer to the power reception resonance coil 33 than to the power reception coil 34c, its amount of received power ordinarily becomes larger than that of the power reception coil 34c.

If the power reception coil 34b closest to the power reception resonance coil 33 is arranged so that its center is (lies) on the same axis as the central axis, its amount of received power becomes larger. In the present embodiment, however, the power reception coil 34b is disposed to be deviated from the central axis by d1, so that the amount of received power decreases by an amount of deviation as mentioned above. Additionally, the power reception coil 34a is closer to the power reception resonance coil in distance than h3, and is affected by the power reception coil 34b, so that its amount of received power decreases.

Therefore, so as to become almost the same level as the amount of power received by the power reception coil 34c having the least amount of received power, arrangement of the power reception coils 34a and 34b is deviated from the same axis, or the power reception coils 34a and 34b are arranged at positions affected by each other. Consequently, if being adjusted by devising the arrangement etc. as mentioned above, the amount of power received by the power reception coils 34a to 34c can be made almost the same level of power.

Incidentally, the above descriptions have been made for their simplicity on the premise that the coils other than the power reception coil 34b are on the same axis. However, the present embodiment is not limited thereto. An intention of the present embodiment is to arrange each of the power reception coils so that their amounts of received power become almost the same level by considering the distance from the power reception resonance coil, the deviation from the central axis, an influence between the power reception coils, and the like.

Sixth Embodiment

Figure 8:
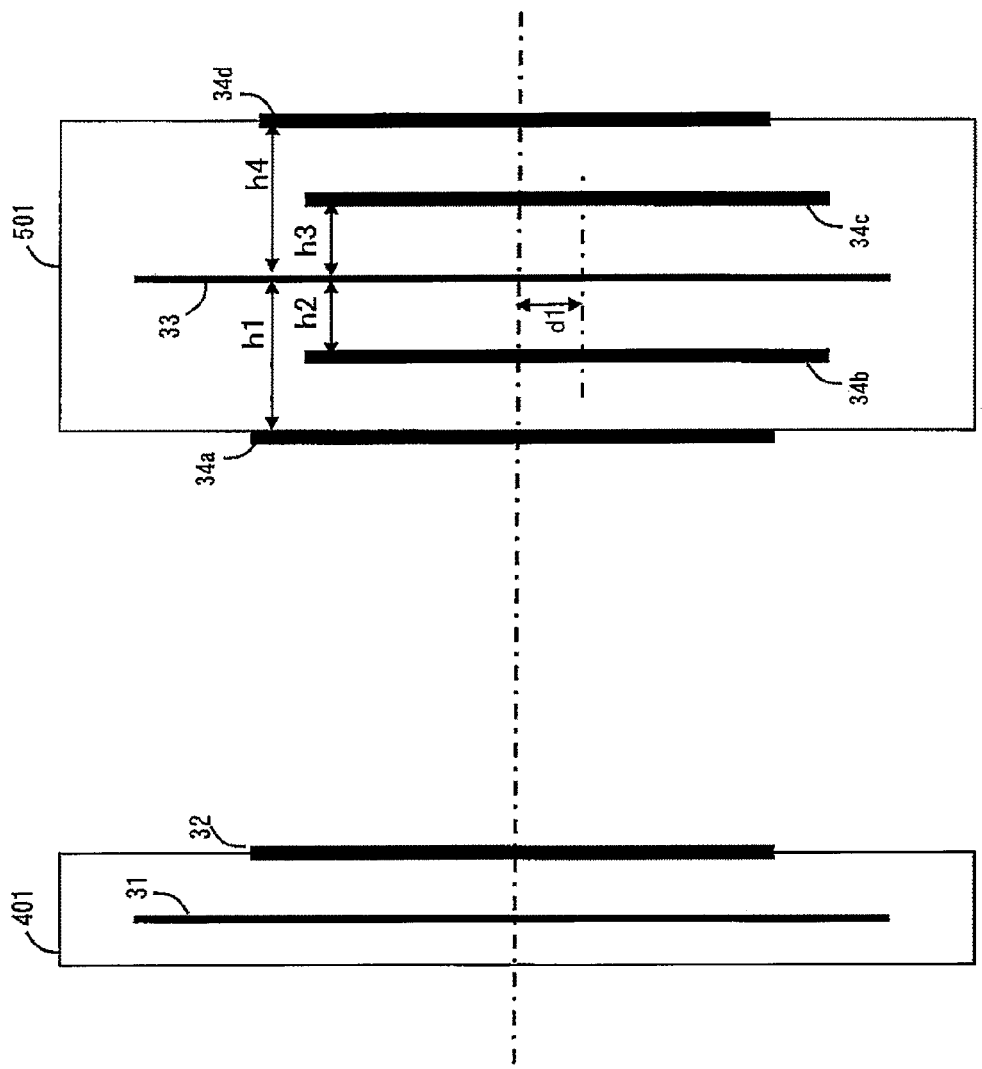
FIG. 8 is a view showing an example of a positional relation between coils in a wireless power transmission/reception system according to a sixth embodiment of the present invention.

A wireless power transmission/reception system in a unit inverter 1 according to the present embodiment will be described with reference to FIG. 8. FIG. 8 is a view showing an example of a positional relation between coils in a wireless power transmission/reception system according to the present embodiment.

FIG. 8 is different from FIG. 7 in that the power transmission coil 32 and the power reception coils 34a and 34b are provided between and separately from printed boards 401 and 501. The power reception coils 34c and 34d are provided opposite the power reception coils 34a and 34b.

The power transmission coil 32 is a coil of one turn that is formed by a copper foil wiring on the printed board 401. Each of the power reception coils 34a to 34c is a coil of one turn that is formed by a copper foil wiring on the printed board 501. Here, it is desirable that the respective amounts of power received by the power reception coils are equal to one another similarly to the fifth embodiment.

In contrast, the wireless power transmission/reception system in the unit inverter 1 according to the present embodiment arranges the power transmission and reception resonance coils 31 and 33 so that their centers are on substantially the same axis (hereinafter, "central axis"). Additionally, the power reception coils 34a and 34d are respectively spaced apart from the power reception resonance coil 33 by distances h1 and h4 on almost the same axis as the central axis.

Meanwhile, the center of the power reception coil 34b coincides with the central axis of the power reception coil 34c, and their coils form a pair of coils. Additionally, the center of the paired coils is deviated from the central axis of the power reception resonance coil by a distance d1, and the power reception coils are respectively spaced apart from the power reception resonance coil 33 by distances h2 and h3. Those distances has a relation of h2, h3<h1, h4 therebetween.

To equalize the amounts of power received by the power reception coils 34a to 34d can be realized by fine-adjusting the distances h2 and h3 of the paired coils and concurrently fine-adjusting the distances h1 and h4 of the paired coils. That is, arranging two sets of paired coils so that their central axes coincide with each other makes it possible to determine, only by the distances h1 to h4, the amounts of power received by the power reception coils 34a to 34d.

As described above, the present embodiment makes the central axes of the two sets of paired coils deviate from each other, so that the respective amounts of power received by the coils can be adjusted at almost the same level only by adjusting the distance of each of the paired coils from the power reception resonance coil 33.

Seventh Embodiment

Figure 9:
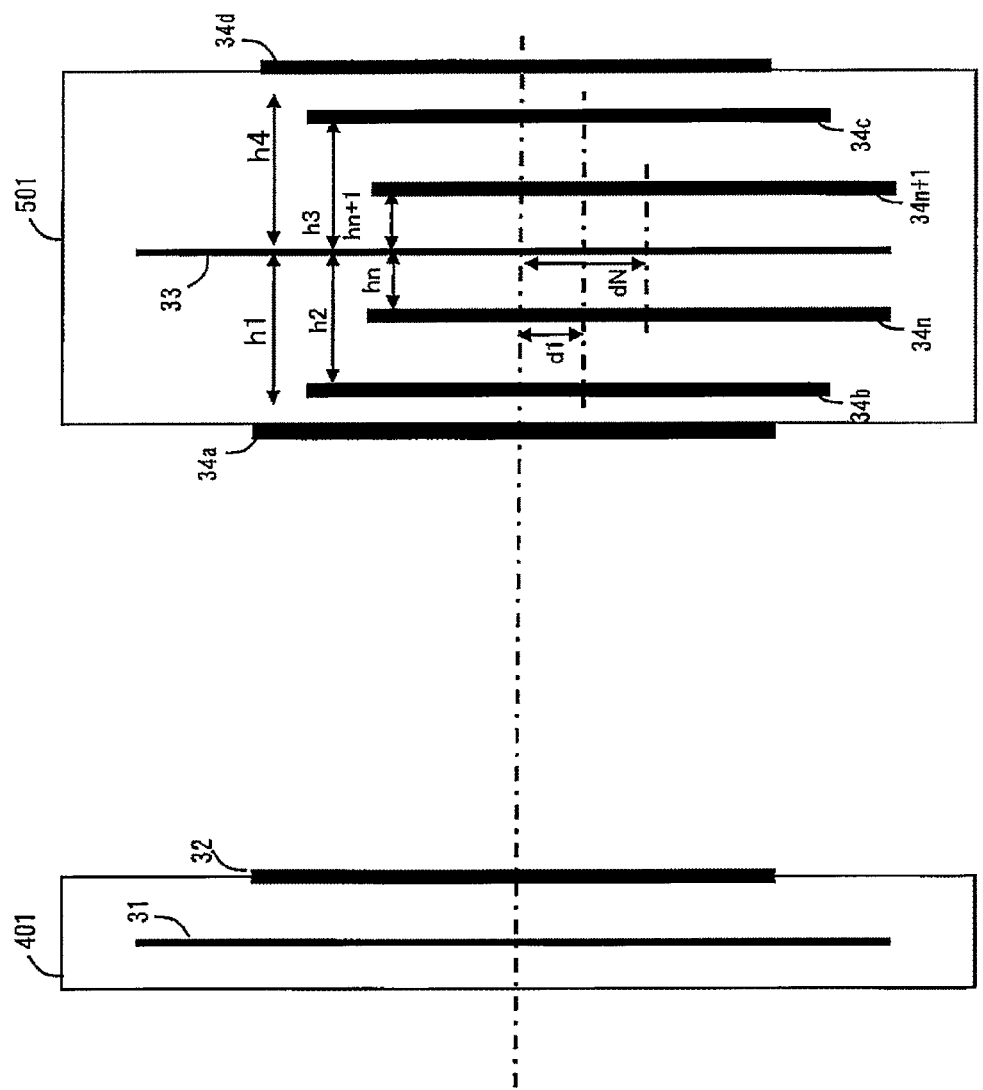
FIG. 9 is a view showing an example of a positional relation between coils in a wireless power transmission/reception system according to a seventh embodiment of the present invention.

A wireless power transmission/reception system in a unit inverter 1 according to the present embodiment will be described with reference to FIG. 9. FIG. 9 is a view showing an example of a positional relation between coils in a wireless power transmission/reception system according to the present embodiment.

Although the number of power reception coils is four in an example of the sixth embodiment, a wireless power transmission/reception system according to the present embodiment is configured to generalize the number of power reception coils to n+1. FIG. 9 is different from FIG. 8 in that a power reception coil 34n is arranged between the power transmission/reception resonance coils 31 and 33, and a power reception coil 34n+1 is provided opposite the power reception coils 34a, 34b, and 34n.

A center of the power reception coil 34n is placed on a central axis of the power reception coil 34n+1, and forms a pair of coils therewith. Additionally, a center of the paired coils is deviated from the central axis of the power reception resonance coil by a distance dN (>dn−1), and further the paired coils are respectively spaced apart from the power reception resonance coil 33 by distances hn and hn+1.

Those distances have a relation of d1<dn−1<dN and a relation of hn, hn+1<hn−1, hn−2<h2, h3<h1, h4 therebetween.

To equalize amounts of power received by the power reception coils 34a to 34n+1 can be realized by fine-adjusting the distances hn and hn+1 of the paired coils, fine-adjusting the distances h2 and h3 of the paired coils, and fine-adjusting the distances h1 and h4 of the paired coils.

That is, arranging the paired coils so that their central axes coincide with each other makes it possible to determine, only by the distances h1 to h4, hn, and hn+1, the amounts of power received by the power reception coils 34a to 34n+1.

As described above, the present embodiment can transmit almost the same level of power to the plural power reception coils from the one power transmission coil.

Incidentally, the present invention is not limited to the embodiments described above, and includes various modification examples. For examples, the above embodiments have been described in detail so as to make the present invention easily understood, and the present invention is not always limited to the embodiment having all of the described constituent elements. Also, a part of the configuration of one embodiment may be replaced with a configuration of another embodiment, and the configuration of one embodiment may be added to the configuration of another embodiment. Furthermore, another configuration may be added to a part of the configuration of each embodiment, and a part of the configuration of each embodiment may be eliminated or replaced with another configuration.

Additionally, part or all of configurations, functions, processing units, and processing means, etc. as described above may be realized by hardware through, for example, design etc. of an integrated circuit(s). Further, each of the configurations and functions, etc. may be realized, by software, through interpretation and execution of a program(s) by a processor(s) for realizing the respective functions. Information on programs, tables, and files, etc. can be stored in recording devices such a memory, hardware, and a SSD (Solid State Drive), or recording media such as an IC card, SS card, and DVD.

Further, control lines and/or information lines are shown about what is considered necessary for describing them. However, all of the control lines and/or information lines are not always shown for products. In fact, almost all of the configurations may be considered connected to one another.

EXPLANATIONS OF LETTERS OR NUMERALS

1: Unit inverter;
2: Wireless power transmission unit;
3: Wireless power reception unit;
4: DC/DC converter unit;
5: Inverter unit;
7: Multiple inverter;
53, 54: Solar panel connection terminal;
11: Transformer;
12a, 12b, 12c, 12d: Switching MOS transistor;
18: Capacitor;
13a, 13b, 13c, 13d: Inverter MOS transistor;
14: Link voltage smoothing capacitor;
15a, 15b, 15c, 15d: Rectifier diode;
51: Positive-side inverter output terminal;
52: Negative-side inverter output terminal;
21: Dc/DC converter control unit;
31: Power transmission resonance coil;
32: Power transmission coil;
39: Transmission amplifier;
38: Oscillator;
41: Power-transmission-unit power supply;
33: Power reception resonance coil;
34a, 34b, 34c: Power reception coil;
35: Diode bridge;
36: Power reception smoothing capacitor; and
37a, 37b, 37c: Gate control circuit.

The invention claimed is:
1. A power conversion device comprising:
an input inverter converting a voltage of DC power from a DC input to AC power;
a transformer having a primary winding and a secondary winding, the primary winding coupled to receive the AC power from the input inverter;
a rectifier coupled to convert AC power from the secondary winding of the transformer to a link DC voltage;
an output inverter converting, to AC power, the link DC voltage provided by the rectifier;
a control unit driving switches of the output inverter to control power conversion by the output inverter;

a wireless power reception unit receiving power fed by wireless power transmission, and supplying the received power as a power supply voltage to the control unit;

a wireless power transmission unit wirelessly transmitting power to the wireless power reception unit; and a power supply unit supplying power to the wireless power transmission unit, wherein the wireless power transmission unit comprises a power transmission coil supplying power, and a power transmission resonance coil transmitting power by magnetic resonance generated with the power transmission coil, the wireless power reception unit comprises a power reception resonance coil magnetically resonating with the power transmission resonance coil, and a plurality of power reception coils receiving power by magnetic resonance generated with the power reception resonance coil, and the power transmission resonance coil and the power transmission reception resonance coil are arranged opposite each other.

2. The power conversion device according to claim 1, wherein the wireless power transmission unit and the input inverter are provided on a first board, the wireless power reception unit and the output inverter are provided on a second board, and the first board and the second boards are provided separately from each other so that the wireless power transmission unit and the wireless power reception units oppose each other.

3. The power conversion device according to claim 1, wherein the plurality of power reception coils oppose the power reception resonance coil, are spaced apart from each other in an axial direction of the power reception resonance coil, and are arranged with respective distances so that their respective amounts of powers received from the power transmission coil are the same.

4. The power conversion device according to claim 1, further comprising an output terminal outputting the AC power converted by the output inverter, wherein a plurality of power conversion devices including the power conversion device and one or more additional power conversion devices, each of the one or more power conversion devices comprising a respective output inverter outputting AC power at a respective output terminal, are connected in series via their respective output terminals.

5. The power conversion device according to claim 4, wherein the power conversion device is a first power conversion device of the plurality of power conversion devices, wherein a second power conversion device in the plurality of power conversion devices comprises a respective wireless power reception unit receiving power fed by wireless power transmission and supplying the received power as a respective power supply voltage to a respective control unit driving switches of the respective output inverter of the second power conversion device, and the wireless power transmission unit of the first power conversion device transmits power to the respective wireless power reception units of the first and second power conversion devices.

6. The power conversion device according to claim 5, wherein a third power conversion device in the plurality of power conversion devices comprises a respective wireless power transmission unit for wirelessly transmitting power, a fourth power conversion device in the plurality of power conversion devices and the third power conversion device each comprise a respective wireless power reception unit receiving power fed by wireless power transmission and supplying the received power as a respective power supply voltage to a respective control unit driving switches of the respective output inverter of the third and fourth power conversion devices, the wireless power transmission unit of the first power conversion device transmits, at a first frequency, power to the wireless power reception units of the first and second power conversion devices, and the wireless power transmission unit of the third power conversion device transmits, at a second frequency, power to the wireless power reception units of the third and fourth power conversion devices.

7. The power conversion device according to claim 1, wherein the wireless transmission unit comprises:

the power supply unit outputting a power transmission waveform;

a modulation circuit modulating the power transmission waveform outputted from the power supply unit to incorporate a control signal in the power transmission waveform; and the power transmission coil transmitting, by magnetic resonance, the power transmission waveform modulated by the modulation circuit, and the wireless power reception unit comprises:

the power reception coil receiving, by the magnetic resonance, the power transmission waveform transmitted from the power transmission coil; and a demodulation circuit demodulating the power transmission waveform power-received by the power reception coil, taking out the control signal therefrom, and outputting it to the control unit.

8. The power conversion device according to claim 7, further comprising a control signal output unit outputting the control signal for controlling the output inverter.

9. A power conversion method comprising:

converting, via an input inverter, a voltage of DC power from a DC input to AC power;

receiving the AC power from the input inverter via a transformer having a primary winding and a secondary winding;

converting AC power from the secondary winding of the transformer to a link DC voltage, via a rectifier;

converting the link DC voltage provided by the rectifier to AC power, via an output inverter;

driving switches of the output inverter to control power conversion by the output inverter, via a control unit;

transmitting, via a wireless power transmission unit, wireless power from a power supply unit;

receiving the transmitted wireless power by a wireless power reception unit to supply it to the control unit;

transmitting power via magnetic resonance with the wireless power transmission unit by supplying power to a power transmission coil of the wireless power transmission unit and a power transmission resonance coil inductively coupled to the power transmission coil, receiving power by magnetic resonance with the wireless power reception unit via a power reception resonance coil of the wireless power reception unit magnetically resonating with the power transmission resonance coil and a plurality of power reception coils inductively coupled with the power reception resonance coil; and the power transmission resonance coil and the power transmission reception resonance coil are arranged opposite each other.

10. The power conversion method according to claim 9, wherein the AC power converted via the output inverter, is outputted, via a plurality of output terminals, and wherein a plurality of power conversion devices including the power conversion device and one or more additional power conversion devices, each of the one or more power conversion devices comprising a respective output inverter outputting AC power at a respective output terminal, are connected in series via their respective output terminals.

11. The power conversion method according to claim 9, wherein a power transmission waveform from the power supply unit is modulated to incorporate a control signal for controlling the output inverter to convert the DC power to the AC power and transmitted by the wireless power transmission unit, and the power transmission waveform is received via the wireless power reception unit and demodulated to take out the control signal therefrom.

* * * * *